(12) United States Patent
Merckling et al.

(10) Patent No.: US 8,994,109 B2
(45) Date of Patent: Mar. 31, 2015

(54) HIGH-K HETEROSTRUCTURE

(71) Applicants: Clement Merckling, Oullins (FR);
Mario El-Kazzi, Lyons (FR);
Guillaume Saint-Girons, Lyons (FR);
Guy Hollinger, Moidieu-Detourbe (FR)

(72) Inventors: Clement Merckling, Oullins (FR);
Mario El-Kazzi, Lyons (FR);
Guillaume Saint-Girons, Lyons (FR);
Guy Hollinger, Moidieu-Detourbe (FR)

(73) Assignees: STMicroelectronics SA, Montrouge (FR); Centre National de la Recherche Scientifique, Paris Cedex (FR); Ecole Centrale de Lyon, Ecully Cedex (FR)

( * ) Notice: Subject to any disclaimer, the term of this patent is extended or adjusted under 35 U.S.C. 154(b) by 0 days.

(21) Appl. No.: 13/832,373

(22) Filed: Mar. 15, 2013

(65) Prior Publication Data
US 2013/0200440 A1 Aug. 8, 2013

Related U.S. Application Data

(62) Division of application No. 12/675,733, filed on Apr. 30, 2010, now Pat. No. 8,426,261.

(30) Foreign Application Priority Data

Aug. 28, 2007 (WO) .................. PCT/IB2007/003415

(51) Int. Cl.
*H01L 27/01* (2006.01)
*H01L 27/12* (2006.01)
*H01L 31/0392* (2006.01)
*H01L 29/51* (2006.01)
*H01L 21/02* (2006.01)
*H01L 21/314* (2006.01)
*H01L 29/04* (2006.01)
*H01L 21/316* (2006.01)
*H01L 21/28* (2006.01)

(52) U.S. Cl.
CPC ............ *H01L 29/045* (2013.01); *H01L 29/513* (2013.01); *H01L 21/02178* (2013.01); *H01L 21/3147* (2013.01); *H01L 21/02192* (2013.01); *H01L 21/02299* (2013.01); *H01L 21/02194* (2013.01); *H01L 21/02293* (2013.01); *H01L 21/02269* (2013.01); *H01L 29/517* (2013.01); *H01L 21/3162* (2013.01); *H01L 21/28194* (2013.01); *H01L 21/022* (2013.01)
USPC .......................................... 257/351; 257/369

(58) Field of Classification Search
CPC ............ H01L 21/823807; H01L 21/84; H01L 21/823878; H01L 27/1203; H01L 29/045
USPC .................... 257/350–353, 368–412, E27.064
See application file for complete search history.

(56) References Cited

PUBLICATIONS

International Search Report, PCT/IB2007/003415, May 26, 2008, 3 pages.
Merckling, et al., "Development of robust interfaces bases on crystalline γ-$Al_2O_3$ (001) for subsequent deposition of amorphous high-k oxides" Microelectronic Engineering 84 (2007) 2243-2246.

(Continued)

*Primary Examiner* — Cuong Q Nguyen
(74) *Attorney, Agent, or Firm* — Gardere Wynne Sewell LLP

(57) ABSTRACT

A method for preparing a multilayer substrate includes the step of deposing an epitaxial γ-$Al_2O_3$ Miller index (001) layer on a Si Miller index (001) substrate.

13 Claims, 2 Drawing Sheets

(56) References Cited

PUBLICATIONS

Merckling, et al., "Pseudomorphic molecular beam epitaxy growth of γ-$Al_2O_3$(001) on Si(001) and evidence for spontaneous lattice reorientation during exitaxy", Applied Physics Letters 89, 23907 (2006), 232907-1-232907-3.

Endres, et al., "Electrical characterization of crystalline $Gd_2O_3$ gate dielectric MOSFETs fabricated by damascene metal gate technology" Microelectronics Reliability 47 (2007) 528-531.

Czernohhorsky, et al., "Impact of oxygen supply during growth on the electrical properties of crystalline $Gd_2O_3$ thin films on Si(001)" Applied Physics Letters 88, 152905 (2006) pp. 152905-1-152905-3.

Merckling, et al., "Growth of crystalline γ$Al_2O_3$ on Si by molecular beam epitaxy: Influence of the substrate orientation" Journal of Applied Physics 102, 024101 (2007) 024101-024101-6.

Merckinlg, et al., "Epitaxial growth and relaxation of γ$Al_2O_3$ on silicon" Thin Solid Films 515 (2007) 6479-6483.

Laha, et al., "Impact of Si Substrate orientations on electrical properties of crystalline $Gd_2O_3$ thin films for high-$K$ application" Applied Physics Letters 89, 143514 (2006) pp. 143514-1-143514-3.

Kwo, et al., "Properties of high $k$ gate dielectrics $Gd_2O_3$ and $Y_2O_3$ for Si" Journal of Applied Physics, vol. 89, No. 7, pp. 3920-3927.

Akai et al: "Fabrication of Pb(Zr,Ti)O3 films on epitaxial Y-Al2O3(100)/Si(001) substrates," Journal of Crystal Growth 259 (2003) pp. 90-94.

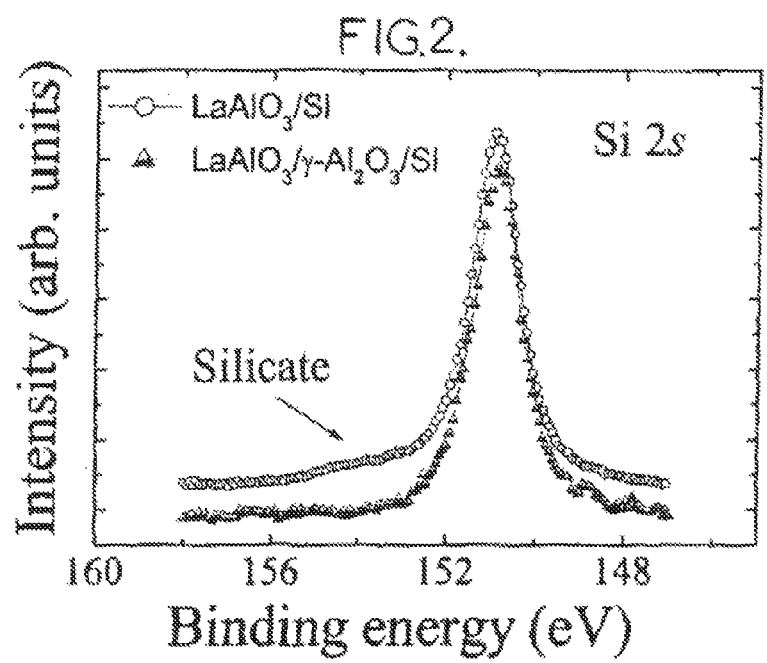
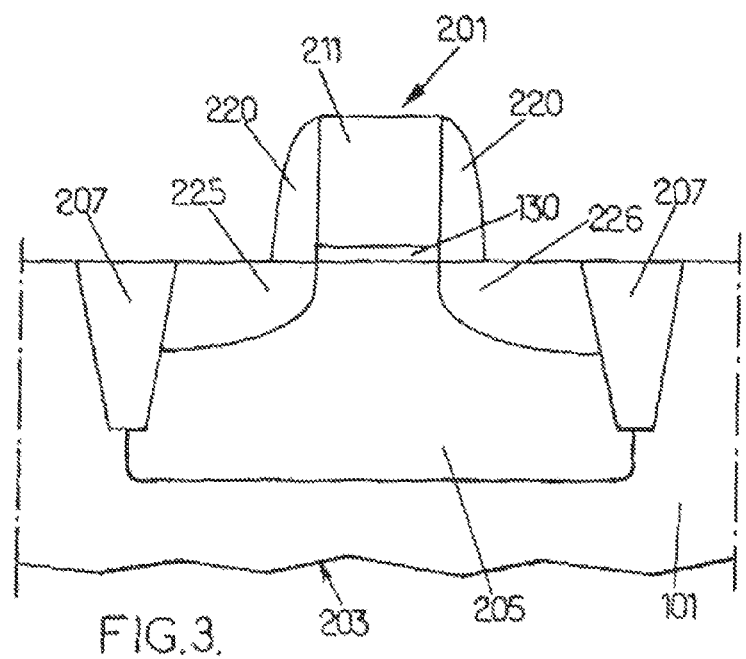

HIGH-K HETEROSTRUCTURE

PRIORITY CLAIM

This application is a divisional of U.S. Ser. No. 12/675,733, filed Apr. 30, 2010, which is a 371 filing from PCT/IB2007/003415 filed Aug. 28, 2007.

TECHNICAL FIELD

The present invention generally relates to a multilayer substrate which may comprise a high-k dielectric layer and a method for preparing such a multilayer substrate.

BACKGROUND

Features of the present application are based on C. Merckling & al. Microelectronic Engineering 84 (2007) 2243-2246 and C. Merckling & al. Appl. Phys. Lett. 89 (2006), the contents of which are hereby incorporated by reference in their entirety.

A traditional metal-oxide-semiconductor (MOS) structure is obtained by depositing a layer of silicon dioxide ($SiO_2$) and a layer of metal on top of a semiconductor die. As the silicon dioxide is a dielectric material its structure is equivalent to a planar capacitor, with one of the electrodes replaced by a semiconductor.

When a voltage is applied across a MOS structure, it modifies the distribution of charges in the semiconductor.

A metal-oxide-semiconductor field-effect transistor (MOSFET) includes two terminals, a source and a drain, each connected to separate highly doped regions. These regions can be either P or N type, but they must both be of the same type. These two regions are separated by a not highly doped region known as the body. The body is of a type different than the one of the said two regions. The MOSFET also includes an electrode called a gate, which is located above the body and insulated from all of the other regions by an oxide, usually $SiO_2$.

Smaller MOSFETs are desirable for several reasons. First, smaller MOSFETs may allow more current to pass, due to their shorter length dimension. Second, smaller MOSFETs have smaller gate areas, and thus lower gate capacitance. A third reason for MOSFET scaling is reduced area, leading to reduced cost. Smaller MOSFETs can be packed more densely, resulting in either smaller chips or chips with more computing power in the same area. Since fabrication costs for a semiconductor wafer are relatively fixed, the cost per integrated circuits is mainly related to the number of chips that can be produced per wafer.

Producing MOSFETs with channel lengths smaller than a micrometer is a challenge, and the difficulties of semiconductor device fabrication are always a limiting factor in advancing integrated circuit technology.

The gate oxide, which serves as insulator between the gate and channel, should be made as thin as possible to increase the channel conductivity and performance when the transistor is on and also to reduce subthreshold leakage when the transistor is off. However, with current gate oxides having a thickness of around 1.2 nm the quantum mechanical phenomenon of electron tunneling occurs between the gate and channel, leading to increased power consumption.

Therefore there is a need for material to replace $SiO_2$.

High-k oxides are good candidates to replace $SiO_2$ as the gate oxide in the future generations of MOSFET devices.

A prior art approach is based on the use of an amorphous high-k oxide layer directly on the crystalline Si substrate. However, epitaxial oxides have superior potential properties because they allow obtaining abrupt oxide-silicon interfaces.

Epitaxial growth of several rare-earth binary oxides and of $SrTiO_3$ has already been demonstrated.

However, these oxides have to be grown at relatively low temperatures between 500° C. and 650° C. and under relatively low oxygen pressures lower than $10^{-8}$ Torr to avoid interfacial reactions leading to the formation of $SiO_2$, silicates, or silicides. In addition, the final oxide/Si structures are not stable enough to be compatible with the thermal budget expected for integration in future generation CMOS devices.

Thus, the present invention seeks to find a method for replacing $SiO_2$ for the gate oxide that would mitigate these drawbacks.

SUMMARY

An object of the present invention is a method for preparing a multilayer substrate, comprising the step of depositing an epitaxial $\gamma$-$Al_2O_3$ Miller index (001) layer on a Si Miller index (001) substrate.

Miller indices are used here to characterize planes and directions in a crystal lattice. Miller indices are a notation commonly used to describe lattice planes and directions in a crystal. In particular, a family of lattice planes is determined by three integers l, m, and n. They are written (l m n) and denote planes orthogonal to a direction (l, m, n) in the basis of the reciprocal lattice vectors.

The precise meaning of this notation depends upon a choice of lattice vectors for the crystal. Usually, the three primitive lattice vectors are used. However, for cubic crystal systems, the cubic lattice vectors are used even when they are not primitive (e.g., as in body-centered and face-centered crystals).

A method according to the invention permits to obtain an epitaxial $\gamma$-$Al_2O_3$ Miller index (001) films on a Si Miller index (001) surface of a Si substrate.

In some embodiments, one might also use one of the following features or any possible combination:
- the epitaxial $\gamma$-$Al_2O_3$ Miller index (001) layer is deposited using molecular beam epitaxy;
- the epitaxial $\gamma$-$Al_2O_3$ Miller index (001) layer is less or equal to 10 atomic monolayers thick, for example less or equal to 3 atomic monolayers thick;
- the operating temperature, for molecular beam epitaxy, is higher or equal to 850° C.;
- the operating oxygen pressure, for molecular beam epitaxy, is lower or equal to $10^{-8}$ Torr;
- previously to the deposit of the $\gamma$-$Al_2O_3$ Miller index (001) layer, the Si substrate is first cleaned in a HF:$H_2O$ solution, then chemically oxidized in a $H_2SO_4$:$H_2O_2$ solution and finally etched in a $NH_4F$ solution;
- a dielectric layer, for example a dielectric oxide layer, is deposited on the $\gamma$-$Al_2O_3$ Miller index (001) layer;
- the dielectric layer is deposited on the $\gamma$-$Al_2O_3$ Miller index (001) layer using molecular beam epitaxy;
- the dielectric is a high-k oxide;
- the dielectric is crystalline;
- the dielectric is $Gd_2O_3$;
- the dielectric is amorphous;
- the dielectric layer is deposited at an operating temperature higher or equal to 700° C.; and
- the dielectric oxide layer is deposited at an operating oxygen pressure lower or equal to $2\times10^{-6}$ Torr.

In addition the present invention provides a multilayer substrate comprising a $\gamma$-$Al_2O_3$ Miller index (001) layer on a Si Miller index (001) layer.

In some embodiments, one might also use one of the following features or any possible combination:
- the multilayer substrate comprise a dielectric oxide layer on top of the $\gamma$-$Al_2O_3$ Miller index (001) layer;
- the dielectric oxide is a high-k oxide;
- the dielectric oxide layer is crystalline;
- the crystalline dielectric oxide layer comprises $Gd_2O_3$ Miller index (001);
- the dielectric oxide layer is amorphous.

According to another aspect, the invention relates to a Complementary Metal-Oxide-Semiconductor comprising a source, a gate, a drain, a well, and a dielectric layer between the well and the gate, wherein said well comprises Si Miller index (001) and the dielectric layer comprises a layer of 10 or less atomic monolayers of $\gamma$-$Al_2O_3$ Miller index (001) at least partly covered by a dielectric oxide layer.

In some embodiments, one might also use one of the following features or any possible combination:
- the dielectric oxide is a high-k oxide;
- the high-k oxide layer comprises crystalline $Gd_2O_3$ Miller index (001),
- the high-k oxide layer is amorphous.

According to another aspect, the invention relates to an electronic chip comprising a Complementary Metal-Oxide-Semiconductor according to the invention.

According to another aspect, the invention relates to an electronic device comprising a Metal-Oxide-Semiconductor according to the invention.

BRIEF DESCRIPTION OF THE DRAWINGS

Other characteristics and advantages of the invention will readily appear from the following description of embodiments, provided as non limitative examples and of the accompanying drawings.

FIG. 2 compares XPS data at normal angle detection for Si 2 s for a multilayer substrate according to the invention and a multilayer substrate according to the prior art; and FIG. 3 is a cross-sectional view of a MOSFET manufactured according to an embodiment of the invention.

DETAILED DESCRIPTION OF THE DRAWINGS

Elements in the figures are illustrated for simplicity and clarity and have not necessarily been drawn to scale. For example, the dimensions of some of the elements in the figure may be exaggerated relative to other elements to help improve the understanding of the embodiments of the present invention.

The wording "on" refers to a relative vertical position when the multilayer substrate is arranged so as the Si crystal layer is substantially situated in a horizontal plane.

In the sense of the invention a "high-k oxide" refers to an oxide with a higher relative dielectric constant k than silicon dioxide k=3.9, for example it refers to an oxide whose relative dielectric constant k is greater than or equal to 10, or for example greater than or equal to 15.

The pressure units used to describe the invention are Torr, one Torr corresponds to $1.3 \times 10^2$ N/m$^2$.

Figure 1A:
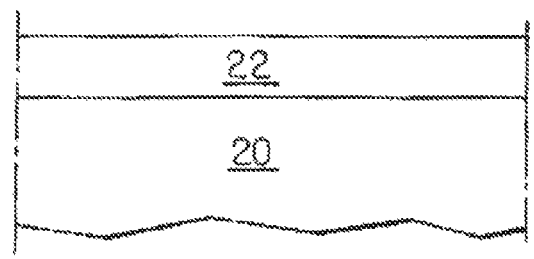
FIGS. 1A and 1B are cross sectional views of multilayer substrates according to different embodiments of the invention.

Using a method according to an embodiment of the invention, as illustrated on FIG. 1A, an epitaxial $\gamma$-$Al_2O_3$ layer 22 can be prepared on crystalline Si Miller index (001) 20 by molecular beam epitaxy (MBE).

First, the crystalline Si Miller index (001) substrate is cleaned in a HF:$H_2O$ (1:10) solution, then it is chemically oxidized in a $H_2SO_4$:$H_2O_2$ (2:1) solution, and finally it is etched in $NH_4F$ (40%) in volume.

Secondly, the $Al_2O_3$ layer 22 is prepared by using an electron gun evaporation of a single $Al_2O_3$ crystal, at an operating temperature higher than 700° C., for example higher than 850° C., and an operating oxygen pressure lower than $2 \times 10^{-6}$ Torr, for example lower than $10^{-8}$ Torr.

The $Al_2O_3$ growth rate can be controlled in situ using a mass spectrometer.

Epitaxial $\gamma$-$Al_2O_3$ layers 22 with no silicate or $SiO_2$ at the $Al_2O_3$—Si interface are obtained using growth temperatures for example higher than 850° C. and oxygen pressures for example lower than $10^{-8}$ Torr to limit thermal silicon etching through Si—O formation.

A cross-section high resolution transmission electron microscopy image of a substrate obtained through the method according to the present embodiment of the invention, as FIG. 2(a) of C. Merckling & al. Appl. Phys. Lett. 89 (2006), attests of the good crystalline quality of the $Al_2O_3$ layer 22: atomic planes can be distinguished, and the Si—$Al_2O_3$ interface is sharp at the atomic scale.

When using this method the inventors have surprisingly observed that the two first $Al_2O_3$ monolayers (1.6 nm) 22 grow in such a way that their Miller index (001) planes are parallel to the Miller index (001) planes of the Si substrate 20 to give Miller index (001)-oriented $Al_2O_3$ lattice, which has never been observed before.

The inventors have observed that above this thickness, the $Al_2O_3$ layer further grows by aligning its Miller index (111) planes to the Miller index (001) planes of the Si substrate to give Miller index (111)-oriented $Al_2O_3$ lattice.

Furthermore, the inventors have surprisingly observed that $Al_2O_3$ Miller index (001) grows in its cubic $\gamma$ phase on Si Miller index (001).

According to an embodiment, the depositing process of an epitaxial $\gamma$-$Al_2O_3$ layer 22 on a Si Miller index (001) substrate 20 will be limited to two monolayers.

The present invention also relates to a multilayer substrate comprising a $\gamma$-$Al_2O_3$ Miller index (001) layer 22 on a Si Miller index (001) 20 layer obtained for example by the method previously described.

According to an embodiment of the invention, the multilayer substrate Si Miller index (001)/$Al_2O_3$ can be used as a buffer layer for the integration of dielectric oxides on crystalline Si.

Using a method according to an embodiment of the invention a dielectric oxide layer is deposited on the $\gamma$-$Al_2O_3$ Miller index (001) layer of a multilayer substrate according to the invention using a molecular beam epitaxy.

Figure 1B:
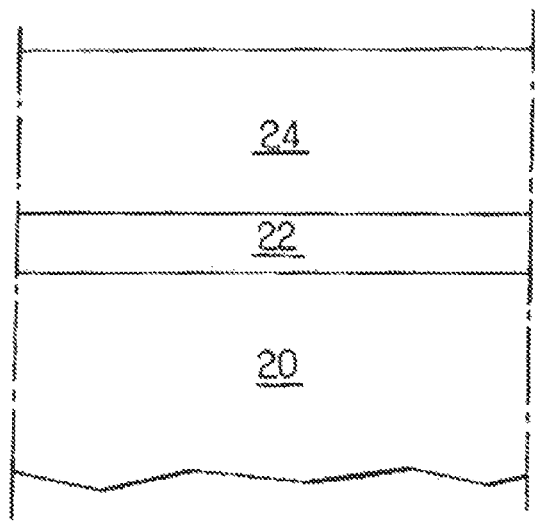

FIG. 1B illustrates a cross sectional view of a multilayer substrate according to the invention.

Such substrate comprises a crystalline Si Miller index (001) layer 20, covered by $\gamma$-$Al_2O_3$ Miller index (001) layer 22, itself covered by a dielectric layer 24.

Preferred dielectrics oxides include high-k dielectrics. Suitable high-k dielectrics include $LaAlO_3$, $SrTiO_3$, $Ta_2O_5$, $TiO_2$, $Al_2O_3$, $ZrO_2$, $HfO_2$, rare-earth oxides such as $La_2O_3$, $Gd_2O_3$, $Y_2O_3$, rare-earth scandates such as $DyScO_3$, and their aluminates and silicates, or combinations thereof. Other high-k dielectrics may include HfSiOx, HfAlOx, HfSiON, barium strontium compounds such as BST, lead based compounds such as $PbTiO_3$, similar compounds such as $BaTiO_3$, $SrTiO_3$, $PbZrO_3$, PST, PZN, PZT, PMN, metal oxides, metal silicates, metal nitrides, combinations and multiple layers of these.

The high-k oxide layer 24 may be crystalline or amorphous depending on the nature of the oxide and the growth conditions.

The high-k oxide is deposed by using an electron gun evaporation of said high-k oxide single crystal, at an operating temperature higher than 750° C. and an operating oxygen pressure lower than $2\times10^{-6}$ Torr.

In embodiments of the invention the high-k dielectric layer 24 is typically 1 nm to 8 nm thick, for example 2 nm to 6 nm thick, for example 4 nm thick.

Remarkably, the operating oxygen pressure can be higher than when deposing the $\gamma$-$Al_2O_3$ Miller index (001) layer 22, and the operating temperature can go up to 850° C.

Indeed the crystalline $\gamma$-$Al_2O_3$ Miller index (001) layer 22 is stable at temperature as high as 850° C. and under oxygen pressure. The use of such an interfacial layer protects the crystalline Si Miller index (001) 20 from the oxygen avoiding the formation of $SiO_2$ at the surface of the Si Miller index (001) 20.

FIG. 2 summarizes the X-Ray photoemission spectrometry (XPS) core level spectra recorded at normal angle detection for Si 2 s.

On FIG. 2 are presented two Si 2 s core level spectra of an amorphous $LaAlO_3$ layer, realized in the same deposition conditions: one with an interfacial layer of $\gamma$-$Al_2O_3$ Miller index (001) layer (—triangles—) and the other one without (—circles—) the interfacial layer, that is directly deposed on the Si Miller index (001) substrate.

Both present a sharp and strong peak at 150.9 eV, which can be attributed to crystalline silicon substrate.

In the case of the $LaAlO_3$/Si Miller index (001) system, the Si 2 s curve presents a component at 153.9 eV which can be associated to the formation of silicates at the interface.

Oppositely, no feature appears on the high binding energy side of Si 2 s core level for the heterostructure with an interface of $\gamma$-$Al_2O_3$ Miller index (001) layer, showing that the $\gamma$-$Al_2O_3$ Miller index (001) layer protects the Si Miller index (001) substrate.

According to embodiments of the invention the high-k dielectric oxide is $Gd_2O_3$. The $Gd_2O_3$ is deposed on the $\gamma$-$Al_2O_3$ Miller index (001) layer by using an electron gun evaporation of $Gd_2O_3$ single crystal, at an operating temperature of 750° C. and an operating oxygen pressure of $5\times10^{-7}$ Torr.

It appears from the Reflection High Energy Electron diffraction (RHEED) that the $Gd_2O_3$ layer on the $\gamma$-$Al_2O_3$ Miller index (001) layer is crystalline.

The inventors have shown that the crystalline structure of the $Gd_2O_3$ layer is so that the Miller index (001) planes of the $Gd_2O_3$ lattice are parallel to the Miller index (001) planes of the $\gamma$-$Al_2O_3$ Miller index (001).

Crystalline multilayer substrates are more stable compare to multilayer substrates comprising an amorphous layer.

Furthermore, an additional layer to be added on the $Gd_2O_3$ layer can be crystalline layer, which is not possible when the high-k layer is amorphous.

As illustrated on FIG. 3, the invention further relates to a complementary Metal-Oxide-Semiconductor comprising a source 225, a gate 211, a drain 226, a well 205, and a dielectric layer 130 between the well 205 and the gate 211. Said well 205 comprises Si Miller index (001) and the dielectric layer 130 comprises a layer of one or two atomic layer of $\gamma$-$Al_2O_3$ Miller index (001) at least partly covered by a high-k oxide layer.

In order to obtain a complementary Metal-Oxide-Semiconductor according to the invention, the multilayer structure of FIG. 1B may be completed according to conventional semiconductor fabrication methods, which may include several of the following steps.

For example, the completing the multilayer structure of FIG. 1B may include forming an MOSFET 201 in an active region 203, i.e., a region for device fabrication, within the crystalline Si substrate 101. The active region 203 may include a well 205 region having dopant of polarity opposite to the source 225 and the drain 211 regions of the corresponding MOS device to be formed.

Over the active region 203, is a high-k gate dielectric 130 formed according to embodiments of the invention.

An isolation structure, such as shallow trench isolation regions 207, may be formed within the crystalline Si substrate 101 to isolate the active regions 205. Said shallow trench isolation regions 207 are formed using conventional thermal growth methods and isolation region deposition and patterning methods.

A gate electrode 211 is formed over the high-k dielectric layer 130. The gate electrode 211 may comprise CVD polysilicon between about 500 and 2,000 angstroms thick. The gate electrode 211 may further include dopant of polarity opposite the channel region of the corresponding MOS device to be formed.

Such doping advantageously provides for enhanced off current (Ioff) performance, enhanced drain saturation current (Idsat) performance and possibly enhanced short channel effect performance of a field effect transistor device formed employing a gate electrode formed from the patterned gate electrode 211.

In other embodiments, the gate electrode 211 comprises a metal gate electrode. The metal gate electrode may comprise a metal or metal alloy such as Ru or W, a meal compound such as TiN, TaN, TaC, or $Mo_2N$, or a metal silicide such as NiSi or MoSi, which may be formed using PVD, ALD, or PECVD, for example.

Dielectric sidewall spacers 220 are deposited using a non-high-k dielectric to provide a protective spacer over the sidewalls of the electrode. The sidewall spacers 220 are for example a nitrogen-containing oxide, silicon nitride, oxide or a stacked combination thereof.

The sidewall spacers 220 may be deposited by low temperature deposition techniques including LPCVD, PECVD and remote plasma CVD. The sidewall spacers 220 may comprise silicon nitride or silicon oxynitrides. In a preferred embodiment the oxide or nitride sidewall spacer 220 may be more than about 40 nm wide. In an example, the sidewall spacers 220 are $SiO_xN_y$, nitride or a stacked combination thereof.

Using the gate electrode and sidewall spacers as a mask, there are formed heavily doped source 226 and drain 225 regions. An N+ source/drain implant may comprise a dose of phosphorus or arsenic dopant between about 1E14 ions/$cm^2$ and 1E16 ions/$cm^2$ at an energy between about 10 keV and 80 keV. After annealing, the concentration of phosphorus or arsenic dopant in the regions 225, 226 is for example between about 5E18 atoms/$cm^3$ and 5E20 atoms/$cm^3$.

Advantageously, such MOSFET according to the invention presents reduced or even no electron tunneling phenomenon and is compatible with the thermal budget expected for integration in future generation CMOS device.

Although, the present invention has been described with reference to preferred embodiments, persons skilled in the art will recognize that changes may be made in form and detail without departing from the scope of the invention.

What is claimed is:

1. A semiconductor device comprising a source, a gate, a drain, a well, and a dielectric layer between the well and the gate, wherein said well comprises a Si Miller index (001) substrate portion and the dielectric layer comprises a layer of 10 or less atomic monolayers of $\gamma$-$Al_2O_3$ Miller index (001) material at least partly covered by a dielectric oxide layer.

2. A semiconductor device according to claim 1, wherein said dielectric oxide layer is a high-k oxide material.

3. A semiconductor device according to claim 2, wherein the high-k oxide material comprises crystalline $Gd_2O_3$ Miller index (001) material.

4. A semiconductor device according to claim 2, wherein the high-k oxide material is amorphous.

5. A multilayer substrate comprising a $\gamma$-$Al_2O_3$ Miller index (001) layer on a Si Miller index (001) layer.

6. The substrate of claim 5 further comprising a dielectric oxide layer on top of the $\gamma$-$Al_2O_3$ Miller index (001) layer.

7. The substrate of claim 6 wherein the dielectric oxide layer is a high-k oxide layer.

8. The substrate of claim 6 wherein the dielectric oxide layer is crystalline.

9. The substrate of claim 8 wherein the crystalline dielectric oxide layer comprises $Gd_2O_3$ Miller index (001) material.

10. The substrate of claim 6 wherein the dielectric oxide layer is amorphous.

11. The substrate of claim 5 wherein the Si Miller index (001) layer supports at least one semiconductor device.

12. The substrate of claim 11 wherein the semiconductor device is a MOS transistor including a dielectric gate oxide layer on top of the $\gamma$-$Al_2O_3$ Miller index (001) layer.

13. The substrate of claim 5 wherein the $\gamma$-$Al_2O_3$ Miller index (001) layer is a layer of 10 or less atomic monolayers thickness.

* * * * *